(12) United States Patent
Simonnet et al.

(10) Patent No.: US 11,532,606 B2
(45) Date of Patent: Dec. 20, 2022

(54) OVERVOLTAGE PROTECTION DEVICE

(71) Applicants: STMicroelectronics (Tours) SAS, Tours (FR); STMicroelectronics S.r.l., Agrate Brianza (IT)

(72) Inventors: Jean-Michel Simonnet, Veretz (FR); Sophie Ngo, St-Avertin (FR); Simone Rascunà, Catania (IT)

(73) Assignees: STMicroelectronics (Tours) SAS, Tours (FR); STMicroelectronics S.r.l., Agrate Brianza (IT)

( * ) Notice: Subject to any disclaimer, the term of this patent is extended or adjusted under 35 U.S.C. 154(b) by 45 days.

(21) Appl. No.: 16/806,257

(22) Filed: Mar. 2, 2020

(65) Prior Publication Data

US 2020/0286883 A1    Sep. 10, 2020

(30) Foreign Application Priority Data

Mar. 5, 2019 (FR) ...................................... 1902245

(51) Int. Cl.
*H01L 27/02* (2006.01)
*H01L 29/04* (2006.01)
(Continued)

(52) U.S. Cl.
CPC .......... *H01L 27/0255* (2013.01); *H01L 29/04* (2013.01); *H01L 29/16* (2013.01);
(Continued)

(58) Field of Classification Search
CPC ..... H01L 27/0255; H01L 29/04; H01L 29/16; H01L 29/1608; H01L 29/2003;
(Continued)

(56) References Cited

U.S. PATENT DOCUMENTS

2006/0181828 A1*  8/2006  Sato ........................ H01L 23/62
                                                                361/91.1
2007/0023779 A1   2/2007  Hirose et al.
(Continued)

FOREIGN PATENT DOCUMENTS

CN        101207283 A      6/2008
CN        101853847 A     10/2010
(Continued)

OTHER PUBLICATIONS

Jiangbiao He, 'A Current-Dependent Switching Strategy for Si/SiC Hybrid Switch-Based Power Converters', IEEE Transactions on Industrial Electronics, vol. 64, pp. 8344-8352, May 2017. (Year: 2017).*

(Continued)

*Primary Examiner* — S M Sohel Imtiaz
(74) *Attorney, Agent, or Firm* — Seed Intellectual Property Law Group LLP

(57) ABSTRACT

Overvoltage protection circuits are provided. In some embodiments, an overvoltage protection circuit includes a first diode made of a first semiconductor material having a bandgap width greater than that of silicon. A second diode is included and is electrically cross-coupled with the first diode. The second diode is made of a second semiconductor material different from the first semiconductor material.

20 Claims, 4 Drawing Sheets

(51) Int. Cl.
  *H01L 29/16* (2006.01)
  *H01L 29/20* (2006.01)
  *H01L 29/417* (2006.01)
  *H01L 29/868* (2006.01)
  *H02H 9/04* (2006.01)

(52) U.S. Cl.
  CPC ...... *H01L 29/1608* (2013.01); *H01L 29/2003* (2013.01); *H01L 29/417* (2013.01); *H01L 29/868* (2013.01); *H02H 9/046* (2013.01)

(58) Field of Classification Search
  CPC . H01L 29/417; H01L 29/868; H01L 27/0248; H02H 9/046; H02H 9/041; H02H 9/04
  See application file for complete search history.

(56) References Cited

U.S. PATENT DOCUMENTS

| | | | |
|---|---|---|---|
| 2007/0166942 A1* | 7/2007 | Cogan | H01L 29/0692 257/E29.026 |
| 2009/0014719 A1* | 1/2009 | Shimizu | H01L 29/66068 257/77 |
| 2009/0072315 A1* | 3/2009 | Hodel | H01L 27/0814 257/E27.06 |
| 2010/0006848 A1 | 1/2010 | Fukuoka et al. | |
| 2010/0202090 A1 | 8/2010 | Shishido et al. | |
| 2010/0237356 A1* | 9/2010 | Haney | H01L 27/0255 257/481 |
| 2014/0001491 A1* | 1/2014 | Klein | H01L 29/861 257/77 |
| 2014/0286085 A1* | 9/2014 | Miyakawa | G11C 11/1695 365/158 |
| 2015/0236008 A1* | 8/2015 | Werthmann | H01L 29/868 438/597 |
| 2016/0156178 A1* | 6/2016 | Yamamoto | H03K 17/693 361/16 |
| 2016/0372920 A1* | 12/2016 | Kinzer | H01L 27/0266 |
| 2017/0069618 A1* | 3/2017 | Altolaguirre | H01L 27/0292 |
| 2017/0098730 A1 | 4/2017 | Mazzillo et al. | |
| 2017/0243937 A1* | 8/2017 | Ward | H01L 29/0834 |
| 2017/0317116 A1* | 11/2017 | Celo | H01L 27/14652 |
| 2018/0277437 A1* | 9/2018 | Yamada | H01L 27/06 |
| 2019/0273488 A1* | 9/2019 | Reiter | H01L 27/0255 |
| 2020/0287463 A1* | 9/2020 | Ishikawa | H02P 27/06 |

FOREIGN PATENT DOCUMENTS

| | | |
|---|---|---|
| CN | 103579300 A | 2/2014 |
| CN | 102779858 B | 8/2014 |
| CN | 104375010 A | 2/2015 |
| CN | 104681743 A | 6/2015 |

OTHER PUBLICATIONS

Kimoto et al., "Promise and Challenges of High-Voltage SiC Bipolar Power Devices," *Energies 9*: 2-15, Nov. 2016.

\* cited by examiner

OVERVOLTAGE PROTECTION DEVICE

BACKGROUND

Technical Field

The present disclosure generally concerns electronic circuits, and more specifically is directed to an overvoltage protection circuit.

Description of the Related Art

An electronic device, for example, an integrated circuit, has terminals between which it receives or supplies a voltage, for example, a power supply voltage or a signal. The voltage has a nominal value for which the device operation is optimal. The device is sometimes submitted to overvoltages. An overvoltage tends to temporarily give the voltage across the device a value greater, in absolute value, than the nominal voltage.

To avoid for an overvoltage to risk altering the operation of the integrated circuit and/or deteriorating the integrated circuit, an electronic overvoltage protection circuit is used.

BRIEF SUMMARY

Various embodiments are provided which overcome all or part of the disadvantages of known overvoltage protection devices.

An embodiment provides an overvoltage protection circuit comprising a first diode made of a first semiconductor material having a bandgap width greater than that of silicon. A second diode is electrically cross-coupled with the first diode, and the second diode is made of a second semiconductor material different from the first semiconductor material.

According to an embodiment, the first semiconductor material is silicon carbide.

According to an embodiment, the silicon carbide has a 4H polytype.

According to an embodiment, the silicon carbide has a 6H polytype.

According to an embodiment, the first semiconductor material is gallium nitride.

According to an embodiment, the first diode comprises an intrinsic region between a P-type doped region and an N-type doped region.

According to an embodiment, the first diode has an anode and a cathode located on opposite surfaces of a substrate.

According to an embodiment, the circuit is configured to provide said protection when an overvoltage biases the first diode in the forward direction.

According to an embodiment, the circuit is configured so that, in the absence of an overvoltage, a voltage is applied in the forward direction of the first diode.

According to an embodiment, the second diode is made of silicon.

According to an embodiment, the second semiconductor material has a bandgap width greater than that of silicon.

An embodiment provides a device comprising a first circuit having a first terminal and a second terminal, and an overvoltage protection circuit coupled between the first and second terminals of the first circuit. The overvoltage protection circuit includes a first diode made of a first semiconductor material having a bandgap width greater than that of silicon, and a second diode electrically cross-coupled with the first diode, the second diode made of a second semiconductor material different from the first semiconductor material.

According to an embodiment, the first and second terminals are input/output terminals of the first circuit.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings.

DETAILED DESCRIPTION

Figure 1:
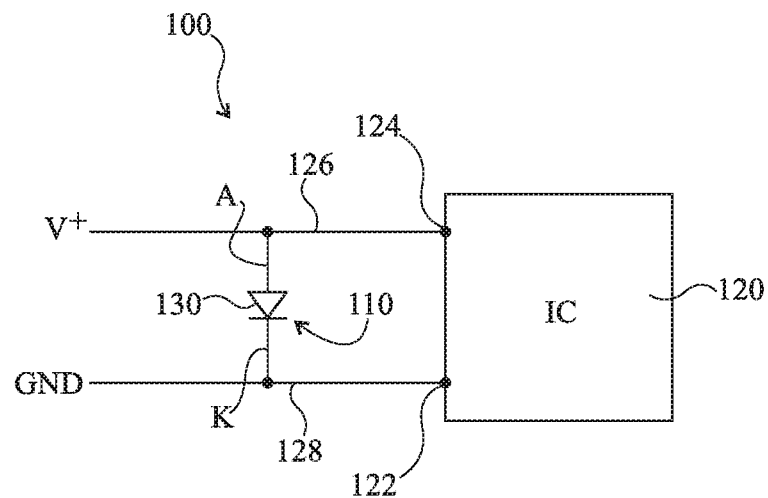
FIG. 1 schematically shows an embodiment of a device comprising an overvoltage protection circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the integrated circuits to be protected are not detailed, the described embodiments being compatible with usual integrated circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "substantially," and "approximately" are used herein to designate a tolerance of plus or minus 10%, preferably of plus or minus 5%, of the value in question.

FIG. 1 schematically shows an embodiment of a device 100 comprising an overvoltage protection circuit 110, and an integrated circuit 120 (IC) protected against overvoltages by circuit 110. Integrated circuit 120 may comprise or may be formed of an electronic chip.

Circuit 120 has two input/output terminals 122 and 124, provided to receive or to supply a voltage, preferably a positive voltage V+, between terminals 124 and 122. A positive voltage between terminals 124 and 122 is a voltage for which the potential of terminal 124 is higher than that of terminal 122. As an example, the voltage is applied to terminals 124 and 122 of circuit 120 via respective electrically-conductive connections 126 and 128. In the shown example, terminal 122 is coupled, preferably connected, to a node of application of a reference potential, for example, ground GND.

In operation, in the absence of an overvoltage, voltage V+ preferably corresponds to a low voltage level, for example, lower than 5 V, preferably equal to approximately 1.8 V or to approximately 3.3 V. As an example, voltage V+ is greater than 0.3 V and voltage V+ is a power supply voltage, for example, a DC voltage. Voltage V+ may also correspond to a high level of digital data conveyed over connection 126, originating from circuit 120 or supplied to circuit 120. In this case, voltage V+ is discontinuously applied, only when the level of the transmitted data is the high level. Voltage V+ may then also correspond to a peak level of analog signals, for example, received by an antenna and supplied to circuit 120, for example in the form of an AC voltage superimposed on a DC voltage. Preferably, the AC voltage has an amplitude below 10 mV, for example below 100 μV or in the order of several μV, i.e., comprised between 2 and 10 μV.

Overvoltages risk occurring between terminals 124 and 122. Such an overvoltage may correspond to a voltage value between terminals 124 and 122 which is temporarily greater than voltage V+ or to a temporarily negative value of this voltage. Such an overvoltage typically occurs when connection 126 is submitted to an electrostatic discharge. Such an overvoltage may also originate from an element generating or receiving voltage V+, such as a voltage source or a signal and/or data supply/receive circuit. Such an overvoltage may also occur at the time when this element is connected to circuit 120 and/or at the time when this element is disconnected from circuit 120.

Circuit 120 comprises components, such as transistors, diodes, capacitive elements, etc., submitted to the voltage applied between terminals 124 and 122. These components are sized for a maximum operating voltage, beyond which they would risk being damaged, or even destroyed, by the overvoltage. Protection circuit 110 is provided to limit risks for the overvoltage to deteriorate the components of circuit 120.

In the present embodiment, protection circuit 110 comprises a diode 130 coupling, preferably connecting, terminals 124 and 122. Anode A of diode 130 is coupled, preferably connected, to terminal 124, and cathode K of the diode is coupled, preferably connected, to terminal 122. Thus, positive voltage V+ is applied in the forward direction of diode 130. Preferably, anode A of diode 130 is coupled, preferably connected, to connection 126. Preferably, cathode K of diode 130 is coupled, preferably connected, to ground. As an example, cathode K of diode 130 is coupled, preferably connected, to connection 128.

Diode 130 is made of a semiconductor material having a bandgap width, that is, the energy difference between the conduction and valence bands, greater than the bandgap width of silicon. Preferably, the semiconductor material of diode 130 is silicon carbide. However, the described embodiments are not limited to silicon carbide, and diode 130 may be made of any semiconductor having a bandgap wider than that of silicon, for example, made of gallium nitride.

Diode 130 has a threshold voltage, defined by the forward voltage for which the diode conducts a given current. Typically, the given value is 1 μA. Preferably, the threshold voltage of the diode is in the range from 2.1 V to 4 V, for example, the threshold voltage is in the range from 2.3 V to 2.4 V.

The threshold voltage is then higher than that of a silicon diode. Preferably, the semiconductor is selected so that the positive voltage V+ across circuit 120 remains, in the absence of overvoltage, smaller than the threshold voltage of diode 130. In other words, diode 130 is non-conductive in the absence of an overvoltage. Diode 130 preferably has the lowest possible leakage current.

If an overvoltage occurs and increases the potential of terminal 124, the overvoltage biases the diode in the forward direction. If the voltage across diode 130 exceeds the threshold voltage, diode 130 turns on and the overvoltage is discharged to ground. Thus, even when the overvoltage occurs, the voltage between terminals 124 and 122 remains limited, typically to a value close to that of the threshold voltage of diode 130. The risk for the voltage between terminals 124 and 122 to damage circuit 120 is this limited. Circuit 120 is thus protected.

Preferably, the semiconductor material of diode 130 is further selected so that diode 130 has a threshold voltage smaller than or in the order of the maximum operating voltage of circuit 120. Thus, preferably, the threshold voltage is between voltage V+ and the maximum operating voltage of circuit 120. Protection circuit 110 then enables, by switching from the non-conductive state in the absence of an overvoltage to the on state during the overvoltage, to avoid for the voltage between terminals 124 and 122 to exceed the maximum operating voltage. There thus is no risk for the voltage between terminals 124 and 122 to damage circuit 120. The circuit is then better protected than if the threshold voltage is greater than the maximum operating voltage.

To obtain a circuit which protects against overvoltages greater than a given threshold and which is non-conductive in the absence of an overvoltage, it could have been devised to use a reverse-biased diode, this diode having a Zener voltage threshold. However, for a threshold voltage equal to the threshold voltage of diode 130, the leakage current flowing in the absence of an overvoltage through the Zener diode would be greater than the leakage current flowing through diode 130. Thus, diode 130 enables, as compared with a reverse-biased diode, to have a decreased leakage current and thus enables to limit the power consumption by device 100 in the absence of an overvoltage. Further, in the case where connection 126 forms a signal transmission line, the higher the leakage current, the more the signal is distorted. A too high deformation could make this signal unusable. As compared with a Zener diode, diode 130 avoids the risk that the signal is too distorted to be usable.

To obtain a circuit which protects against overvoltages greater than a given threshold and which is non-conductive in the absence of an overvoltage, it could also have been devised to use silicon diodes electrically coupled in series between terminals 122 and 124, the anodes of the diodes facing terminal 124. The threshold voltage of the series association of the diodes then corresponds to the sum of the voltage thresholds of the diodes. However, for a threshold voltage of the series association of the silicon diodes equal to the threshold voltage of diode 130, the leakage current flowing in the absence of an overvoltage in the series association would be greater than the leakage current flowing through diode 130. Thus, diode 130 enables, as compared with a series association of silicon diodes, to have a decreased leakage current and thus enables to limit the power consumption by device 100 in the absence of an overvoltage.

As an example, for a series association of eight silicon diodes, a threshold voltage of the series association comprised between 2.3 and 2.4 V, and a given potential V+ (referenced to ground) equal to 1.8 V, a leakage current of the order of 45 nA is measured. For this potential V+, diode 130, in the case where it is made of silicon carbide, typically conducts less than approximately 1 nA. Besides, the protection against overvoltage is provided by only one diode 130, which is easier to integrate and occupies less space than a series association of several diodes, for example eight diodes.

Further, it could have been devised to use in the protection circuit a transistor or a thyristor triggered by avalanche effect with snap back effect for limiting the voltage when the overvoltage is applied and, to limit the leakage current, to select an avalanche voltage greater than the maximum operating voltage of the circuit to be protected. However, the voltage applied to the circuit to be protected would reach at the beginning of the overvoltage an avalanche triggering peak. The circuit to be protected would thus only be protected after the voltage peak. Conversely to a protection circuit triggered by an avalanche effect, diode 130 turns on as soon as voltage V+ exceeds the threshold voltage of the diode. Thus, the voltage between terminals 124 and 122 of circuit 120 to be protected remains smaller than the maximum operating voltage from as soon as the overvoltage has begun. Thereby, the protection by diode 130 is improved over that of a protection circuit triggered by avalanche effect, even with a snap back effect. Further, diode 130 has, over a circuit comprising transistors, the advantage of being simpler to form.

Figure 2:
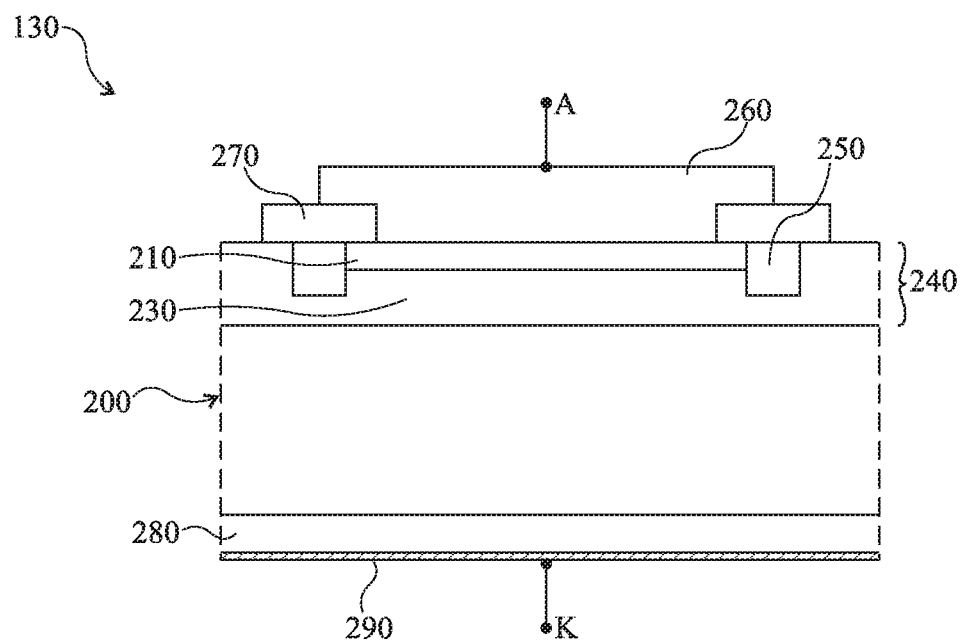
FIG. 2 schematically shows a cross-section view of an embodiment of an overvoltage protection circuit.

FIG. 2 schematically shows a cross-section view of an embodiment of an overvoltage protection circuit. More particularly, FIG. 2 shows a diode 130 of the type described hereabove in relation with FIG. 1.

Diode 130 comprises a substrate 200, made of a semiconductor having a bandgap width greater than that of silicon, preferably made of silicon carbide. Preferably, silicon carbide has a 4H or 6H polytype. The described embodiments are not limited to the 4H and 6H polytypes and are compatible with any polytype of silicon carbide, for example, the 3C polytype. Preferably, substrate 200 is N-type doped. More preferably substrate 200 is N+ type doped, i.e., with a doping level in the range from $5*10^{16}$ to $5*10^{18}$ atoms/cm$^3$ (where the sign "^" represents the exponent function). The substrate thickness is for example in the range from 100 μm to 350 μm.

Diode 130 comprises a P-type doped region 210 covering the upper surface of substrate 200, that is, the front surface of substrate 200. P-type doped region 210 forms, with N-type doped substrate 200, a PN junction.

Preferably, diode 130 further comprises a region 230 made of an intrinsic semiconductor material located between region 210 and substrate 200. The term intrinsic semiconductor here designates a semiconductor which is not intentionally doped, or which has a doping level lower than $5*10^{16}$ atoms/cm$^3$. The semiconductor material of region 230 is preferably the same, to within the doping, as that of substrate 200. Although region 230 is preferably made of silicon carbide, the described embodiments are not limited to silicon carbide. Preferably, the silicon carbide of intrinsic region 230 has the same polytype as substrate 200.

P-type doped region 210 and intrinsic region 230 are preferably located in a same semiconductor layer 240. More particularly, to form regions 230 and 210, layer 240 is first formed, preferably in intrinsic form. Preferably, layer 240 results from a step of epitaxial growth on the front surface of substrate 200. Then, an upper portion of layer 240 is doped to form region 210 and the lower portion of layer 240 is left intrinsic. The portion which has been left intrinsic forms region 230. As a variation, region 210 may be doped during its forming by epitaxy. A buffer layer (not shown) between substrate 200 and intrinsic region 230 may be provided. The material of this buffer layer is the same as that of substrate 200 and intrinsic region 230 and has a doping level between those of substrate 200 and intrinsic region 230.

Preferably, region 210 occupies on the substrate a surface area in the range from 100 μm$^2$ to 0.1 mm$^2$. Region 210 is preferably doped with aluminum or boron atoms. The doping level of P-type region 210 is preferably greater than $10^{18}$ atoms/cm$^3$. Region 210 preferably has a substantially constant thickness, for example in the range from 20 nm to 1 μm. The thickness of layer 240 is preferably in the range from 100 nm to 10 μm.

Preferably, a P-type doped ring-shaped region 250 is further formed around region 210. Ring-shaped region 250 extends from the front (upper) side of layer 240 to a level located in intrinsic region 230 and under the lower level of P-type doped region 210. Preferably, ring-shaped region 250 totally surrounds region 210. Preferably, ring-shaped region 250 has an inner side in contact with the sides of region 210.

Region 210 is covered with an electrically-conductive region 260. Conductive region 260 is for example made of a metallic material. Conductive region 260 is in contact with P-type doped region 210 and forms an anode contacting area. Conductive region 260 forms or is coupled to, preferably connected to, terminal A of diode 130.

Preferably, an electric insulator 270, for example, made of silicon oxide, which insulates conductive region 260 and ring-shaped region 250 from each other, is provided. Insulator 270 totally covers ring-shaped region 250 and preferably extends over a portion of the edges of region 210.

Substrate 200 is covered on its rear surface side with a conductive layer 290, for example, metallic, which forms with region 200 a cathode contacting area of diode 130. The layer forms or is coupled to, preferably connected to, cathode terminal K of the diode.

In diode 130, intrinsic region 230 located between anode and cathode regions 210 and 200 of the diode enables, with respect to a diode having no such intrinsic region, to decrease the stray capacitance of the diode between its cathode and its anode. As an example, the stray capacitance of diode 130 is smaller than 200 pF/mm$^2$. In the case where the data are conveyed over connection 126 (FIG. 1), the data may be conveyed at a rate which is all the higher as the stray capacitance of the diode is low. Thus, with diode 130 comprising intrinsic region 230, circuit 120 can supply and/or receive data at a higher rate than with a diode having no such intrinsic region.

Figure 3:
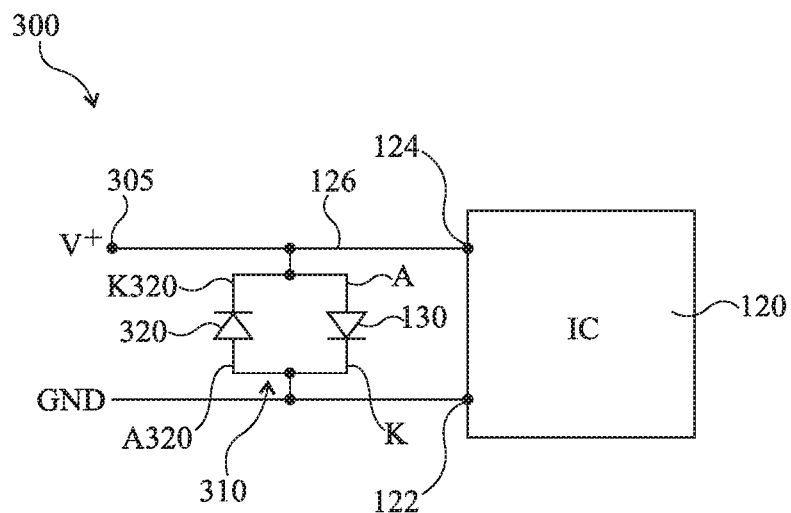
FIG. 3 schematically shows another embodiment of a device comprising an overvoltage protection circuit.

FIG. 3 schematically shows another embodiment of a device 300 comprising an overvoltage protection circuit 310, and a circuit 120 protected against overvoltages by circuit 310.

Circuit 120 comprises elements identical or similar to those of circuit 120 of FIG. 1, that is, two terminals 122 and 124 provided to receive or supply a voltage. This voltage preferably corresponds to positive voltage V+ of FIG. 1, that is, to a power supply voltage or to a high level of digital data conveyed over connection 126, or also to a peak level of analog signals, or also to any positive nominal voltage applied to circuit 120 or originating from circuit 120. In the shown example, terminals 124 or 122 are coupled, preferably connected, to nodes of application 305 and GND of voltage V+.

Protection circuit 310 comprises, like protection circuit 110 of FIG. 1, a diode 130 made of a semiconductor material having a bandgap width greater than that of silicon, to provide a protection against overvoltages tending to increase the voltage between terminals 124 and 122. Diode 130 has its anode A coupled, preferably connected, to terminal 124 of circuit 120, and its cathode K coupled, preferably connected, to terminal 122 of circuit 120. Thus, diode 130 protects circuit 120 against overvoltages tending to cause, between terminals 124 and 122, a positive voltage value greater than a threshold, and diode 130 is non-conductive in the absence of an overvoltage.

Protection circuit 310 further comprises, electrically in parallel with diode 130, a diode 320. Diodes 130 and 320 are positioned head-to-tail. Thus, diode 320 has its anode A320 coupled, preferably connected, to terminal 122 of circuit 120. Cathode K320 of diode 320 is coupled, preferably connected, to terminal 124 of circuit 120.

According to a first embodiment, diode 320 is made of silicon or of a semiconductor material having a bandwidth smaller than that of silicon. As a variation, diode 320 is of Schottky type In case of an overvoltage tending to make the voltage between terminals 124 and 122 negative, diode 320 turns on as soon as the negative voltage becomes, in absolute value, greater than the threshold voltage of the diode. Further, diode 320 is in the non-conductive state when the voltage between terminals 124 and 122 is positive in the absence of an overvoltage. Further, diode 320 is non-conductive when this voltage is zero or substantially zero, that is, zero to within 0.2 V, preferably to within 0.1 V. Such a zero or substantially zero voltage typically corresponds to a low level of data conveyed over connection 126.

In the first embodiment, protection circuit 310 thus protects circuit 120 both against any overvoltage tending to cause a rise in the voltage between terminals 124 and 122 and against any overvoltage tending to make this voltage negative. Further, in the absence of an overvoltage, the protection circuit is non-conductive when the voltage between terminals 124 and 122 is positive and smaller than the threshold voltage of diode 130 and when this voltage is zero or substantially zero.

According to a second embodiment, diode 320 is made of a semiconductor material having a bandgap width greater than that of silicon. In case of an overvoltage tending to make the voltage between terminals 124 and 122 negative, diode 320 turns on as soon as the negative voltage becomes, in absolute value, greater than the threshold voltage of the diode.

Further, due to the fact the bandgap width of the material of diode 320 is greater than that of silicon, the diode remains non-conductive when the voltage between terminal 124 and 122 is lightly negative, for example, in absolute value, smaller than 5 V, preferably equal to approximately 1.8 V or to approximately 3.3 V. Thereby, circuit 120 may be configured to operate with a negative voltage between terminals 124 and 122, preferably a voltage greater than 0.3 V in absolute value, more preferably greater than 0.6 V in absolute value.

In the second embodiment, protection circuit 310 thus protects circuit 120 against any overvoltage tending to cause an increase, in absolute value, in the voltage between terminals 124 and 122. Further, in the absence of an over-voltage, the protection circuit is non-conductive when the voltage between terminals 124 and 122 is negative and smaller, in absolute value, than the threshold of the voltage of diode 320, and when this voltage is positive and smaller than the threshold voltage of diode 130.

Preferably, the semiconductor material is the same for diodes 130 and 320. Preferably, diodes 130 and 320 are made of silicon carbide having the same polytype. Threshold values of the diodes identical in absolute value are thus obtained. The voltage between terminals 124 and 122 in the absence of an overvoltage may be an AC voltage, that is, alternately positive and negative. The AC voltage is for example symmetrical with respect to the zero voltage. The protection is thus ensured symmetrically with respect to the zero voltage. Such an AC voltage may typically originate from a power supply or also, for example, from an antenna. The AC voltage may also be supplied by circuit 120. Circuit 130 is compatible with any AC voltage having a peak amplitude smaller than the threshold voltage of diodes 130 and 320.

Preferably, diodes 130 and 320 each comprise an intrinsic layer between their doped cathode and anode regions. Diodes 130 and 320 are preferably of the type of the diode of FIG. 2 and may comprise an intrinsic semiconductor region between the anode and cathode semiconductor regions. The stray capacitances of the two diodes and then decreased, as has been detailed in relation with FIG. 2. The frequency of the AC voltage may then be higher with a circuit comprising such intrinsic layers than with a circuit comprising no such intrinsic layers.

Figure 4:
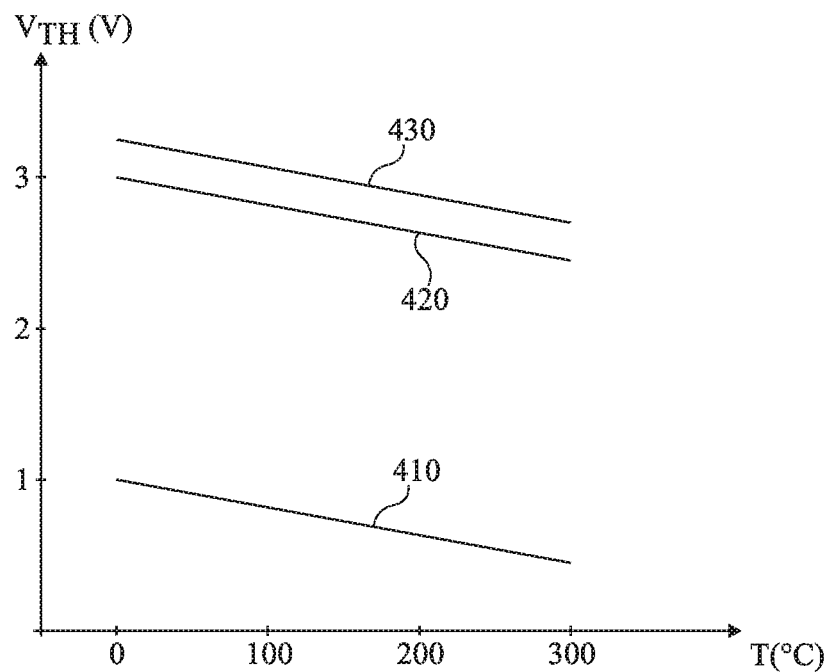
FIG. 4 is a diagram schematically illustrating, according to temperature, shapes of threshold voltages of overvoltage protection circuits comprising different semiconductor materials.

FIG. 4 is a diagram schematically illustrating, according to temperature (in abscissas, in ° C.), variation curves of threshold voltages $V_{TH}$ (in ordinates, in V). More particularly, the threshold voltage 410 of a silicon diode and threshold voltages 420 and 430 of protection circuits according to the above-described embodiments have been shown. Threshold voltage 420 corresponds to a protection circuit comprising a diode made of silicon carbide having the 6H polytype, and threshold voltage 430 corresponds to a protection circuit comprising a diode made of silicon carbide having the 4H polytype.

Threshold voltages 410, 420, and 430 decrease as the temperature increases. Threshold voltage 410 of the silicon diode decreases by more than 40% when the temperature increases from 0° C. to 300° C. Threshold voltages 420 and 430 of the silicon carbide diodes decrease by more than 15% when the temperature increases from 0° C. to 300° C. The threshold voltage decreases by a percentage which is all the smaller as the bandgap width of the semiconductor is large. Thus, diodes made of a semiconductor material with a bandgap width greater than that of silicon have threshold voltages which decrease relatively less, when the temperature rises, than the threshold voltage of a silicon diode. Thereby, the embodiments of protection circuits 110 and 310 of FIGS. 1 and 3 have, as the temperature rises, threshold voltages which decrease less than that of a series association of silicon diodes.

As mentioned hereabove, the threshold voltage of diode 130 is preferably between voltage V+ applied to circuit 120 and the maximum operating voltage admissible by the circuit to be protected. This occurs in a temperature range which is all the wider as the variations of the threshold voltage according to temperature are small. Thus, the protection circuits of the above-described embodiments have operating temperature ranges wider than those of a protection circuit based on series-associated silicon diodes. As an example, the operating temperature range of protection circuit 110 of FIG. 1 and of circuit 310 of FIG. 3 is in the range from −40° C. to 125° C., preferably from −20° C. to 85° C.

The threshold voltage 420 of silicon carbide having the 6H polytype is smaller than the threshold voltage 430 of silicon carbide having the 4H polytype. This illustrates that the threshold voltage of diode 130, when the latter is made of silicon carbide, depends on the polytype of the silicon carbide. Preferably, the silicon carbide polytype is selected according to the targeted threshold voltage (mainly linked to the voltage V+ necessary for correct operation of integrated circuit 120) and/or to the targeted operating temperature range.

Figure 5:
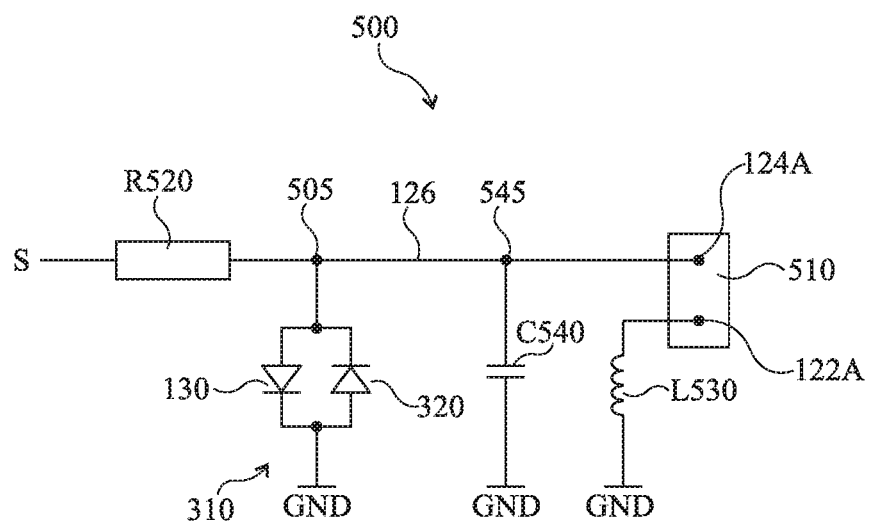
FIG. 5 schematically shows another embodiment of a device comprising an overvoltage protection circuit.

FIG. 5 schematically shows another embodiment of a device 500 comprising an overvoltage protection circuit. The protection circuit is for example a circuit of the type of circuit 310 described in relation with FIG. 3. Thus, circuit 310 comprises head-to-tail diodes 130 and 320 in parallel (in other words, diodes 130 and 320 are cross-coupled) between ground GND and a node 505 of connection to connection 126. Diode 130 has its anode facing node 505 and its cathode facing ground. As in the previous embodiments, diode 130 is made of a semiconductor having a bandgap width greater than that of silicon. Diode 320 may be made of silicon or of a semiconductor having a bandgap width greater than that of silicon.

The device comprises a connector 510 intended to be connected to a cable for power supply or the communication of signals and/or data, not shown. Connection 126 is intended to be connected to a circuit to be protected, not shown. Connection 126 couples a terminal 124A of connector 510 to a resistor R520. Connector 510 further comprises a terminal 122A coupled to ground, for example, by an inductance L530. A capacitor C540 is coupled, preferably connected, between ground and a node 545 of connection to connection 126. Node 545 may be located, between node 505 and resistor R520, or be located, as shown, between node 505 and connector 510. Resistor R520 is coupled to a node of application of a data signal S or of power supply of the circuit to be protected.

Data signal S preferably has low and high potential levels, referenced to ground. Preferably, the high level corresponds to a positive potential and the low level corresponds to a substantially zero potential. Resistor R520, capacitor C540, and inductance L530 play the role of filters. Each of diodes 130 and 320 preferably comprises an intrinsic region, such as intrinsic region 230 of FIG. 2, between the doped anode and cathode regions. As has been mentioned, the data rate may be higher when the intrinsic region is provided than when the diodes have no such intrinsic region.

Figure 6:
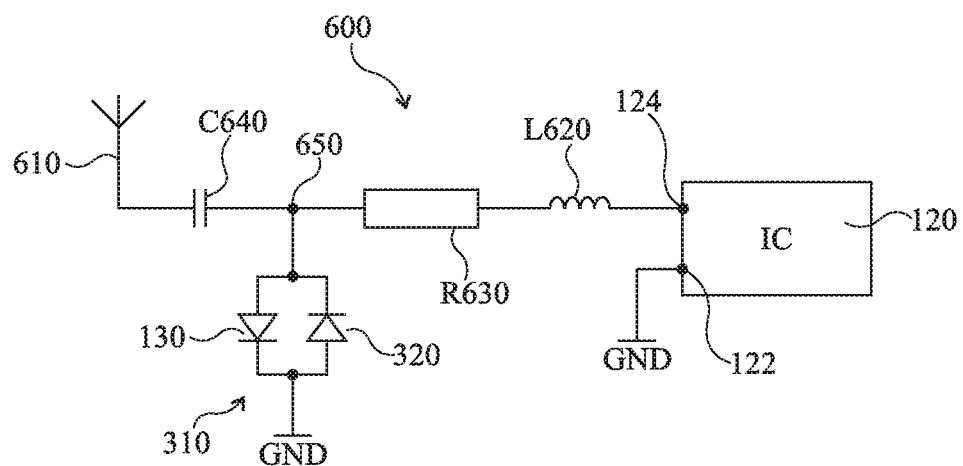
FIG. 6 schematically shows another embodiment of a device comprising an overvoltage protection circuit.

FIG. 6 schematically shows another embodiment of a device 600 comprising an overvoltage protection circuit. More particularly, device 600 is a radio wave receive device.

Device 600 comprises a circuit 120 to be protected against overvoltages. Circuit 120 is for example a receive circuit of a satellite positioning system (GNSS, "Global Navigation Satellite System").

Circuit 120 has a terminal 122 coupled to ground and a terminal 124. Terminal 124 is a terminal of reception of a signal from an antenna 610. Terminal 124 is coupled to antenna 610 by an inductance L620, a resistor R630, and a capacitor C640 electrically in series. As an example, the inductance is on the side of circuit 120 and capacitor C640 is on the side of antenna 610.

The device further comprises a protection circuit 310 of the type of that in FIG. 3. Thus, circuit 310 comprises head-to-tail diodes 130 and 320 electrically in parallel. The cathode of diode 130 and the anode of diode 320 are coupled, preferably connected, to each other and to ground. The anode of diode 130 and the cathode of diode 320 are coupled together to a connection node 650 between capacitor C640 and resistor R630. The cathode of diode 320 and the anode of diode 130 may also be coupled together to any other node of the series association of resistor R630, of inductance L620, and of capacitor C640.

As in the previous embodiments, diode 130 is made of a semiconductor having a bandgap width greater than that of silicon. Diode 320 is preferably made of silicon.

Radio waves received by antenna 610 cause AC variations of the voltage across protection circuit 310, superimposed with a DC voltage of the order of 0.4 V provided by circuit 120. Capacitor C640 prevents the DC voltage from reaching antenna 610. As mentioned, the leakage current flowing through the diodes is decreased with respect to the leakage current in a device based on Zener- or avalanche-effect diodes or with respect to a device based on a series association of silicon diodes. This leakage current corresponds to a portion of the signal received by antenna 610 which does not reach circuit 120. By decreasing the leakage current, the portion of the signal which is effectively received by circuit 120 is thus increased. Device 600 thus has an increased radio wave reception sensitivity.

Figure 7:
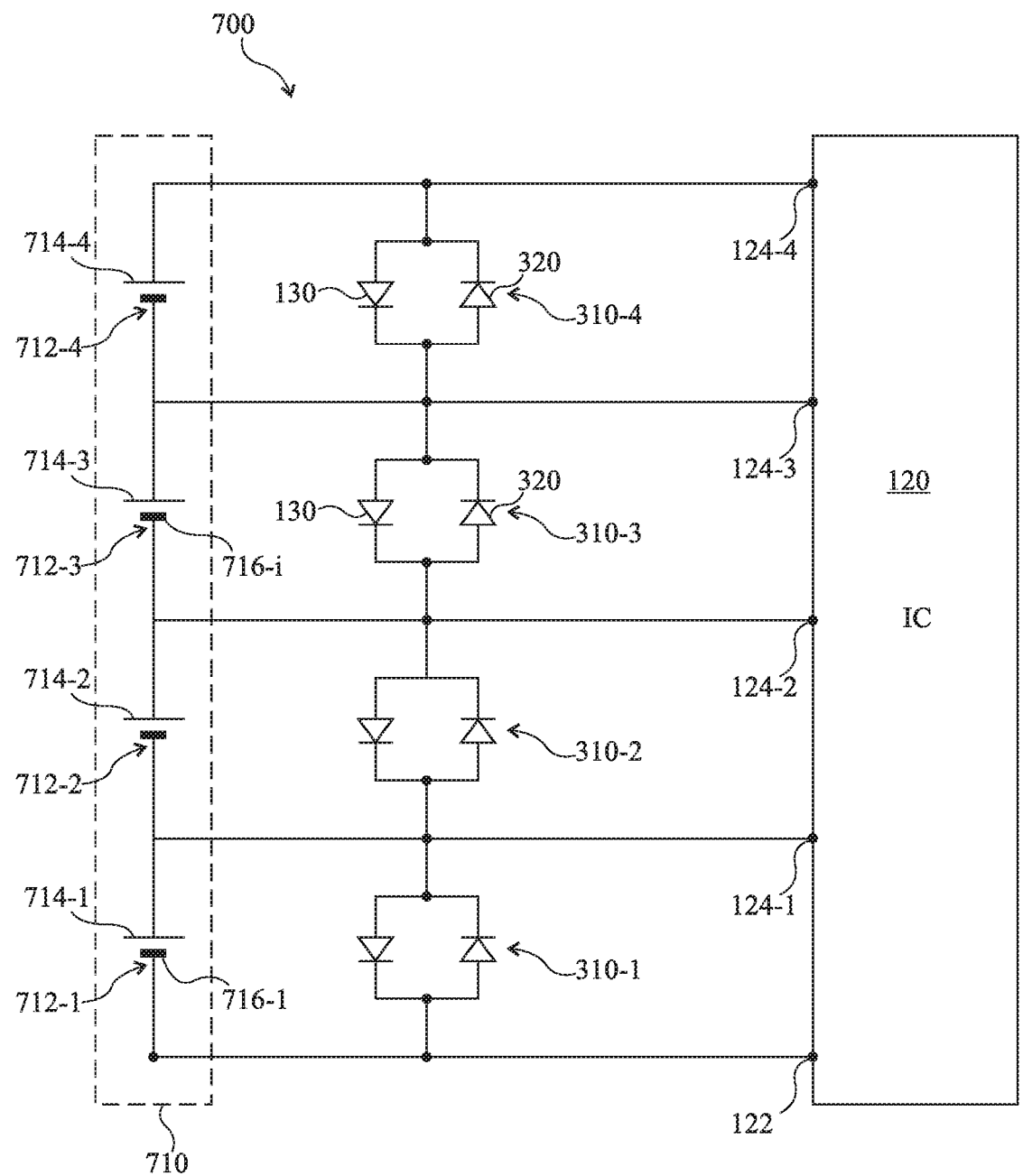
FIG. 7 schematically shows another embodiment of a device comprising overvoltage protection circuits.

FIG. 7 schematically shows another embodiment of a device 700 comprising overvoltage protection circuits.

Device 700 comprises a battery 710, for example, a lithium battery. Battery 710 comprises series-coupled elements 712_i, i being an integer in the range from 1 to N. In the shown example, N=4 and battery 710 comprises four elements 712_1, 712_2, 712_3, and 712_4. Each element 712_i for example corresponds to an elementary electrochemical cell. Each element 712_i has a positive terminal 714_i (714_1, 714_2, 714_3, and 714_4) and a negative terminal 716_i. The negative terminal 716_i of each element 712_i, other than the first element, 712_1, of the series association, is coupled, preferably connected, to the positive terminal of the previous element of the series association.

Battery 710 is coupled, preferably connected, to an integrated circuit 120 (IC). Circuit 120 is for example a battery charge and discharge control circuit, preferably of BMS ("battery management system") type. In particular, each positive terminal 714_i is coupled, preferably connected, to a terminal 124_i (124_1, 124_2, 124_3, 124_4) of circuit 120. The negative terminal 716_1 of the first element, 712_1, of the series association is coupled to a terminal 122 of circuit 120. Terminals 124_i for example correspond to analog inputs for measuring the voltages across elements 712_i.

For each element 712_i, device 700 comprises a protection circuit 310_i (310_1, 310_2, 310_3, 310_4) electrically in parallel with element 712_i. Thus, each circuit 310_i comprises head-to-tail diodes 130 and 320 electrically in parallel with element 712_i. As in the previous embodiments, diode 130 is a semiconductor having a bandgap width greater than that of silicon. Diode 320 is preferably made of silicon.

The leakage currents flowing through diodes 130 are decreased with respect to leakage currents in protection circuits comprising Zener-type diodes having threshold voltages for example below 5 V, or comprising series associations of silicon diodes. Thus, as compared with such protection circuits, circuits 310_i enable an improvement in the measurement and control of the voltage of elements 712_i of the battery during charging or discharging.

Various embodiments and variations have been described. It should be understood by those skilled in the art that certain features of the various embodiments and variations may be combined, and other variations will occur to those skilled in the art. In particular, one or a plurality of additional diodes in series with each diode made of a semiconductor material having a bandgap width greater than that of silicon may be provided. Such additional diode(s) may be made of silicon or of a semiconductor material having a bandgap width greater than that of silicon.

Further, the N and P conductivity types of the described embodiments may be inverted at the same time as the signs of the described voltages and overvoltages.

Finally, the practical implementation of the described embodiments and variations is within the abilities of those skilled in the art based on the functional indications given hereabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An overvoltage protection circuit, comprising:
a first diode made of a first semiconductor material having a bandgap width greater than that of silicon, the first diode including:
a first doped region having a first conductivity type;
an intrinsic region on the first doped region;
a second doped region in the intrinsic region and having a second conductivity type opposite the first conductivity type, the second doped region being spaced from the first doped region by the intrinsic region; and
a ring-shaped doped region, in the intrinsic region and having the second conductivity type, the ring-shaped doped region laterally surrounding the intrinsic region and being spaced from the first doped region by the intrinsic region; and
a second diode electrically cross-coupled with the first diode, the second diode made of a second semiconductor material different from the first semiconductor material.

2. The overvoltage protection circuit of claim 1, wherein the first semiconductor material is silicon carbide.

3. The overvoltage protection circuit of claim 2, wherein the silicon carbide has a 4H polytype.

4. The overvoltage protection circuit of claim 2, wherein the silicon carbide has a 6H polytype.

5. The overvoltage protection circuit of claim 1, wherein the first semiconductor material is gallium nitride.

6. The overvoltage protection circuit of claim 1, wherein the first conductivity type is N-type and the second conductivity type is P-type.

7. The overvoltage protection circuit of claim 1, wherein the first diode has an anode and a cathode located on opposite surfaces of a substrate.

8. The overvoltage protection circuit of claim 1, wherein the overvoltage protection circuit is configured to provide said overvoltage protection when an overvoltage biases the first diode in the forward direction.

9. The overvoltage protection circuit of claim 1, wherein the overvoltage protection circuit is configured to apply a voltage in the forward direction of the first diode in the absence of an overvoltage.

10. The circuit of claim 1, wherein the second diode is made of silicon.

11. The circuit of claim 1, wherein the second semiconductor material has a bandgap width greater than that of silicon.

12. A device, comprising:
a first circuit having a first terminal and a second terminal; and
an overvoltage protection circuit coupled between the first terminal and the second terminal of the first circuit, the overvoltage protection circuit including:
a first diode made of a first semiconductor material having a bandgap width greater than that of silicon, the first diode including:
a first doped region having a first conductivity type;
an intrinsic region on the first doped region;
a second doped region in the intrinsic region and having a second conductivity type opposite the first conductivity type, the second doped region being spaced from the first doped region by the intrinsic region; and
a ring-shaped doped region in the intrinsic region and having the second conductivity type, the ring-shaped doped region laterally surrounding the intrinsic region and being spaced from the first doped region by the intrinsic region; and
a second diode electrically cross-coupled with the first diode, the second diode made of a second semiconductor material different from the first semiconductor material.

13. The device of claim 12, wherein the first and second terminals are input/output terminals of the first circuit.

14. The device of claim 12, wherein the first semiconductor material is silicon carbide.

15. The device of claim 14, wherein the silicon carbide has at least one of a 4H polytype or a 6H polytype.

16. The device of claim 12, wherein the first semiconductor material is gallium nitride.

17. The device of claim 12, wherein the first conductivity type is N-type and the second conductivity type is P-type.

18. An overvoltage protection circuit, comprising:
a first diode, the first diode including:
a substrate of a first semiconductor material having a bandgap width greater than that of silicon, the substrate including an N-type doped region;
an intrinsic region of the first semiconductor material on the N-type doped region, the intrinsic region having a first surface opposite to a second surface;
a first P-type doped region in the intrinsic region, the first P-type doped region being spaced from the N-type doped region by the intrinsic region;
a second P-type doped region in the intrinsic region and having a ring-shape, the second P-type doped region laterally surrounding the intrinsic region and being spaced from the N-type doped region by the intrinsic region, the first P-type doped region and the second P-type doped region being between the first and second surfaces of the intrinsic region;
an anode on the first P-type doped region; and
a cathode on a surface of the substrate opposite the intrinsic region.

19. The overvoltage protection circuit of claim 18, wherein the first semiconductor material is silicon carbide having at least one of a 4H polytype or a 6H polytype.

20. The overvoltage protection circuit of claim 18, further comprising:
    a second diode electrically cross-coupled with the first diode, the second diode made of a second semiconductor material different from the first semiconductor material.

\* \* \* \* \*